United States Patent
Kim

(10) Patent No.: US 7,222,286 B2
(45) Date of Patent: May 22, 2007

(54) DECODING DEVICE HAVING A TURBO DECODER AND AN RS DECODER CONCATENATED SERIALLY AND A METHOD OF DECODING PERFORMED BY THE SAME

(75) Inventor: Ki-bo Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 482 days.

(21) Appl. No.: 10/261,444

(22) Filed: Oct. 2, 2002

(65) Prior Publication Data

US 2003/0135809 A1 Jul. 17, 2003

(30) Foreign Application Priority Data

Jan. 11, 2002 (KR) ................... 2002-1813

(51) Int. Cl.
 *H03M 13/00* (2006.01)
(52) U.S. Cl. .............. 714/784; 714/785; 714/786; 714/755; 714/756
(58) Field of Classification Search ............. 714/755, 714/784, 792, 756, 786
 See application file for complete search history.

(56) References Cited

U.S. PATENT DOCUMENTS

| 6,029,264 | A | 2/2000 | Kobayashi et al. |
| 6,298,461 | B1 | 10/2001 | Tong et al. |
| 2002/0023246 | A1 * | 2/2002 | Jin ........................... 714/755 |

FOREIGN PATENT DOCUMENTS

| DE | 10139116 A1 | 3/2002 |
| EP | 1009098 A1 | 6/2000 |
| EP | 1017180 A2 | 7/2000 |
| EP | 1079529 A2 | 2/2001 |
| JP | 2000-183758 | 6/2000 |
| JP | 2001-186023 | 7/2001 |
| JP | 2001-358596 | 12/2001 |

OTHER PUBLICATIONS

Schurgers et al. "Adaptive turbo decoding for indoor wireless communication; 1998 URSI International Symposium on Signals, Systems, and Electronics, ISSSE 98, pp. 107-111; Oct. 2, 1998."*
Shibutani, A. et al., Reducing average number of turbo decoding iterations. In: Electronics Letters, vol. 35, No. 9. Apr. 29, 1999, pp. 701-702 (In English).
German Office Action for corresponding German patent application no. 10254187.6-35 dated Jun. 1, 2006.

* cited by examiner

*Primary Examiner*—Guy J. Lamarre
(74) *Attorney, Agent, or Firm*—Staas & Halsey LLP

(57) ABSTRACT

A decoding device having a turbo decoder and an RS decoder concatenated serially and a method of decoding performed by the same. A turbo decoder decodes received data of a channel and an RS decoder RS decodes the turbo decoded data. A controller controls the turbo decoder to iteratively turbo-decode the data according to a number of iterations determined by a stored iteration number and to cease the turbo decoding if an error correction completion signal is received from the RS decoder. The controller decreases the iteration number for a next frame of the data if the completion signal is received within the predetermined number of iterations and increases the iteration number for a next frame if the completion signal is not received within the predetermined number of iterations. The iteration number is changeable within maximum and minimum limits and may exceed the maximum limit in special cases.

21 Claims, 2 Drawing Sheets

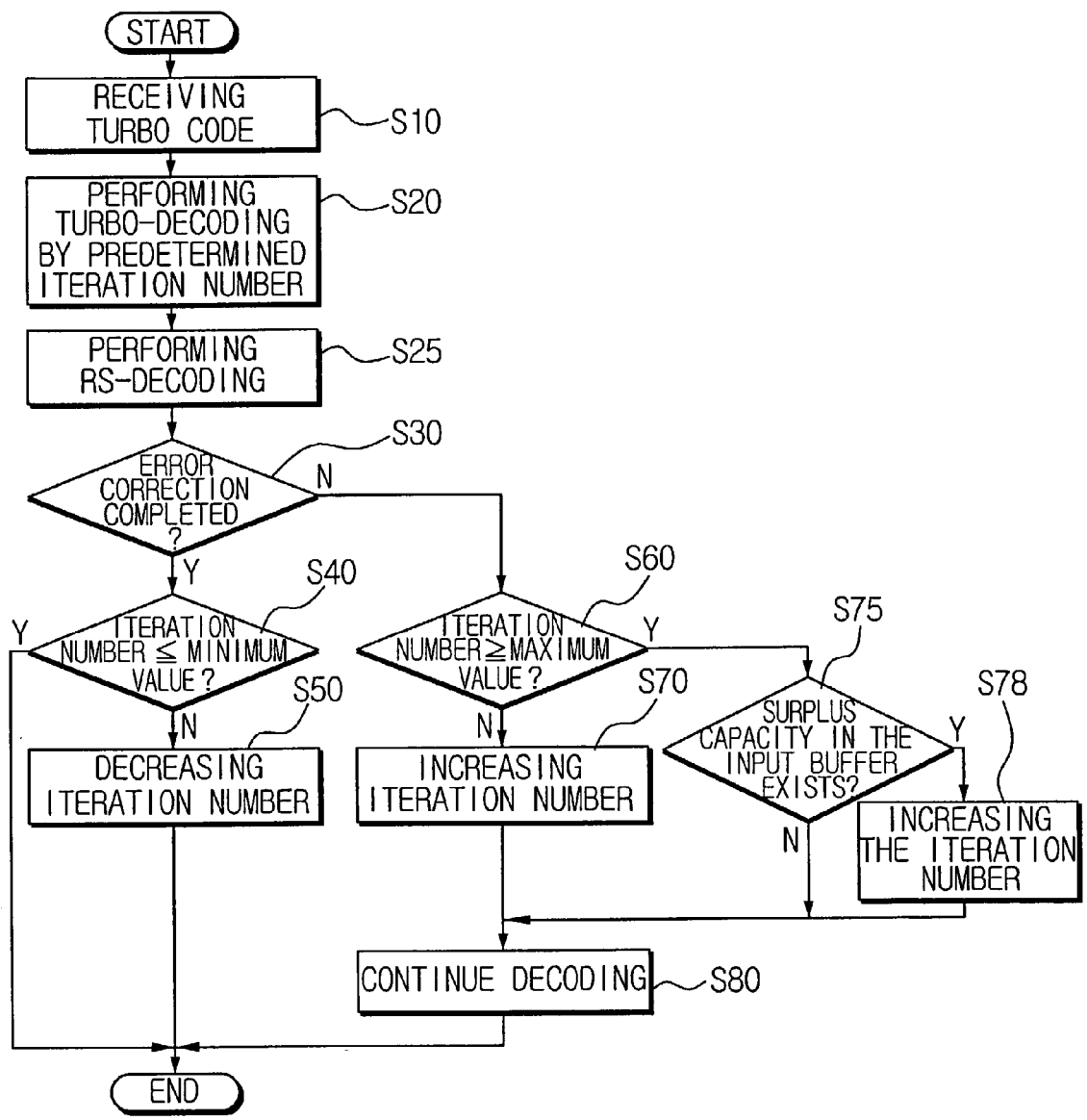

DECODING DEVICE HAVING A TURBO DECODER AND AN RS DECODER CONCATENATED SERIALLY AND A METHOD OF DECODING PERFORMED BY THE SAME

CROSS REFERENCE TO RELATED APPLICATIONS

This application claims the benefit of Korean Application No. 2002-1813 filed Jan. 11, 2002 in the Korean Industrial Property Office, the disclosure of which is incorporated herein by reference.

BACKGROUND OF THE INVENTION

1. Field of the Invention

The present invention relates to a decoding device having a turbo decoder and an RS decoder serially concatenated, and more particularly, to a device for decoding a signal which has undergone both an RS encoding and a turbo encoding, and a decoding method thereof.

2. Description of the Related Art

Generally, in order to correct an error on a channel, a wireless digital communication system uses a method of adding an error correction code in a transmitting terminal and a method of correcting the error in a receiving terminal. One of the coding methods used for the error correction is a turbo code. The turbo code is employed for a channel in need of a high data rate such as CDMA2000 used in the USA, and W-CDMA used in Europe.

FIG. 1 is a block diagram of a conventional decoding device for decoding a received turbo code.

A signal received through a channel passes an input buffer 10 and is input into a turbo decoder 20. The turbo decoder 20 decodes a turbo code by an iterative decoding method and the decoded signal is transmitted to an output buffer 70.

The turbo code varies in the error correction capacity according to an iteration number of the iterative decoding operation. As the iteration number gets greater, the possibility of error correction increases. However, if the iteration number is too great, a decoding time becomes long and power consumption for decoding increases. Therefore, a controller 40 ceases the iterative decoding once the error correction is performed beyond a particular level.

Two conventional criteria determining methods of ceasing the iterative decoding are described below.

The first method is to predetermine an iteration number and cease the iterative decoding when the iteration number reaches the predetermined iteration number. However, this method may increase the decoding time and power consumption as the unnecessary iterative decoding may be performed even though an error is sufficiently corrected. Additionally, this method has a problem that the desired error correction performance may not be achieved as the iterative decoding can be ceased although the error correction is not completed.

The second method is to have a separate LLR (Log Likelihood Ratio) calculator or CRC (Cyclic Redundancy Check) generator 30 as shown in FIG. 1. In other words, it is a method that, by performing the CRC on the signal decoded during the iterative turbo decoding or producing the LLR of the decoding results, the decoding is ceased when it is determined that the error correction is completed according to the CRC result or when the minimum value of the absolute values of the LLR is higher than a predetermined threshold value.

However, in the method using the CRC, the turbo code should be encoded again according to the CRC method, which may cause a data rate loss and the CRC result may be incorrect.

In addition, the method using the LLR has a difficulty in determining a proper threshold value for ceasing the iteration, and errors may still occur even though the LLR conditions are met.

The iteration control of the turbo decoder by the method mentioned above can be adopted even if the error correction is done by the turbo decoder alone. Recently, a new error correction method using both a turbo decoder and a Reed Solomon Decoder (RS decoder) is suggested (U.S. Pat. No. 6,298,461) where a decoding result of an RS decoder is used to control the iteration of the turbo decoder to get a better decoding result.

SUMMARY OF THE INVENTION

The present invention is made to overcome the above-identified problems and accordingly it is an object of the present invention to provide a decoding device which prevents unnecessary and insufficient decoding of signals which are encoded by the RS encoder and a turbo encoder, and which optimizes error correction performance.

Additional objects and advantages of the invention will be set forth in part in the description which follows, and, in part, will be obvious from the description, or may be learned by practice of the invention.

In order to achieve the above and other objects of the invention, a decoding device according to the present invention comprises a first decoder which decodes an input signal in a predetermined first fashion, a second decoder which decodes the input signal decoded by the first decoder in a predetermined second fashion, and outputs a completion signal when an error correction is completed by the decoding in the second fashion, and a controller which controls the first decoder to perform decoding as many times as a predetermined iteration number and to cease the decoding when the completion signal occurs in the second decoder. An example of the first decoder here is a turbo decoder and an example of the second decoder is an RS decoder.

The controller reduces the iteration number where the completion signal occurs in the second decoder as a result of the second decoding of the turbo decoded inputs by the turbo decoder as many times as the iteration number and increases the iteration if the completion signal is not received. Accordingly, the decoding performance becomes optimized by the adaptive changes in the iteration number according to the channel condition.

The controller may control the iteration number within predefined minimum and maximum iteration limits. The controller sets a minimum value as the iteration number if the iteration number would become smaller than the minimum value, and sets a maximum value as the iteration number if the iteration number would become greater than this maximum value. Accordingly, the minimum iteration of turbo decoding is secured and iterations excessively greater than the predefined maximum or less than the minimum iteration are avoided except in special cases which are discussed below.

The decoding device according to the present invention further comprises an input buffer which temporarily stores input data to the turbo decoder and an output buffer which temporarily stores an output of the RS decoder. The controller may set the iteration number to be greater than the predefined maximum value if the input buffer has storage capacity available or the output buffer does not have storage capacity available. Accordingly, error correction with better performance is possible without unnecessary time delay.

The current iteration number and the predefined minimum and maximum values are stored in a memory and the stored iteration number is used for a next frame.

BRIEF DESCRIPTION OF THE DRAWINGS

The above and other objects and characteristic of the present invention will be more apparent by describing an embodiment of the present invention with reference to the accompanying drawings, in which:

FIG. 3 is a flow chart of a method of decoding of the decoding device shown in FIG. 2.

DESCRIPTION OF THE PREFERRED EMBODIMENT

Figure 1:
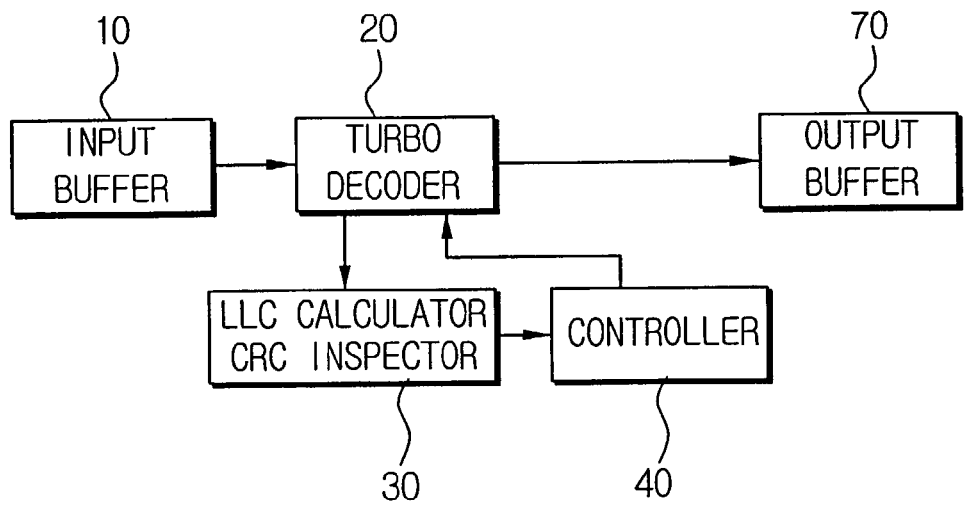
FIG. 1 is a block diagram of a conventional turbo decoding device.

Reference will now be made in detail to the present embodiments of the present invention, examples of which are illustrated in the accompanying drawings, wherein like reference numerals refer to like elements throughout.

The decoding device according to the present invention decodes signals which are encoded by an RS encoder and a turbo encoder. In other words, a signal transmitter has an RS encoder and a turbo encoder and accordingly the signals to be transmitted are encoded by the RS encoder to be a block code and then encoded again by the turbo encoder.

Figure 2:
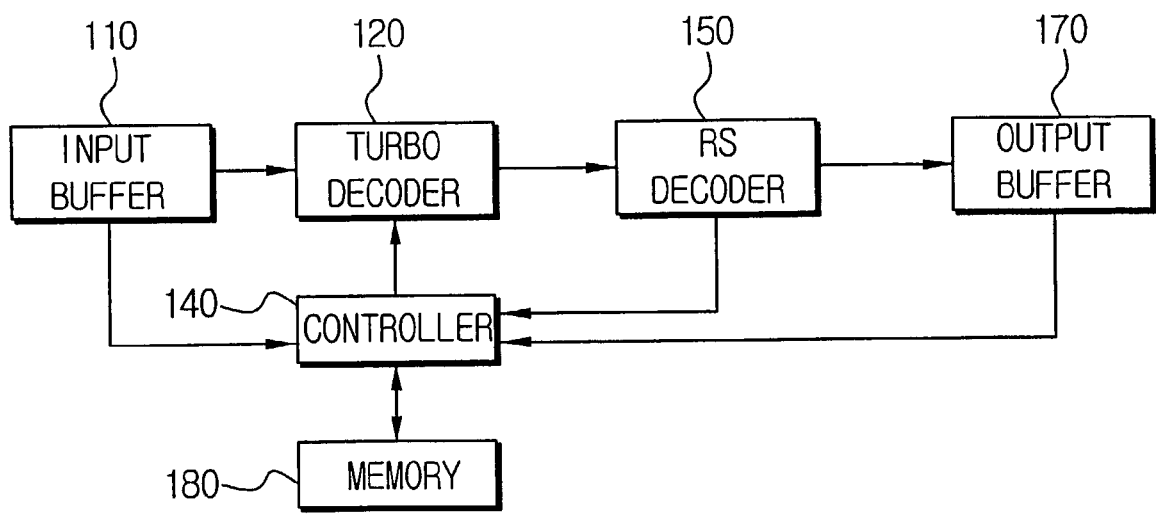
FIG. 2 is a block diagram of a decoding device according to an embodiment of the present invention.

FIG. 2 is a block diagram of the decoding device according to an embodiment of the present invention. The decoding device comprises an input buffer 110, a turbo decoder 120, an RS decoder 150, an output buffer 170, a controller 140, and a memory 180.

The input buffer 110 temporarily stores the input signals (input data) and the stored signals are provided to the turbo decoder 120. The output buffer 170 temporarily stores signals (RS decoded data) decoded by the RS decoder 150. The turbo decoder 120 performs iterative turbo-decoding of the signal input from the input buffer 110 (turbo decoded data).

The RS decoder 150 performs RS-decoding of the signal turbo-decoded by the turbo decoder 120. When an error correction is completed by the RS-decoding process of the RS decoder 150, the RS decoder 150 outputs an error correction (EC) completion signal. If all errors are corrected by the RS decoder 150, the error correction by the turbo decoder 120 is regarded as sufficient. Therefore, if the RS decoder 150 outputs the error correction completion signal, the error correction by the turbo decoder 120 and the RS decoder 150 is judged to be sufficient.

The memory 180 stores an iteration number of the turbo decoder 120 and predefined maximum and minimum iteration values of the iteration number. The controller 140 controls the turbo decoder 120 so that the turbo decoder 120 performs decoding as many times as the iteration number stored in the memory 180. In addition, the controller 140 updates the iteration number stored in the memory 180 according to the completion signal from the RS decoder 150.

The decoding method according to the present invention will now be described.

Referring now to FIG. 3, the received signal (turbo code) is sent to the turbo decoder 120 after being saved to the input buffer 110 at operation S10. The turbo decoder 120 performs turbo-decoding on the received signal at operation S20 (S20). The turbo decoder 120 is controlled by the controller 140 and the controller 140 controls the turbo decoder 120 to iterate the decoding as many times as the iteration number preset in the memory 180.

The turbo-decoded signal (turbo decoded data) is sent to the RS decoder 150 to perform the RS-decoding on the input signal at operation S25 to output RS decoded data. The RS decoder 150 determines whether the error correction is completed, and outputs the error correction completion signal at operation S30 if the error correction is completed. The error correction completion signal is sent to the controller 140 to show the completion of the error correction.

If the controller 140 receives the completion signal, the controller 140 determines whether the iteration number stored in the memory 180 is greater than the predefined minimum value stored in the memory at operation S40. If the stored iteration number is greater than the predefined minimum value, the controller decreases the iteration number in the memory 180 by one (1) at operation S50. If the reduction of the iteration number would make the iteration number less than or equal the predefined minimum value at operation S40, the controller 140 does not decrease the iteration number.

If the completion signal is not received after the RS decoding, some errors are presumed to still exist after the RS decoding. The controller 140 determines at operation S60 whether the iteration number is greater than or equal to the predefined maximum value at operation S60. If the iteration number is not greater than or equal to the predefined maximum value, the controller 140 increases the iteration number in the memory 180 by one at operation S70 and controls the turbo decoder 120 to continue the turbo decoding on a current frame of the received signal at operation S80 since the error correction is not sufficiently completed. If, at operation, S60, the iteration number would be greater than or equal the predefined maximum value if increased, the controller 140 determines at operation S75 whether surplus capacity in the input buffer 110 exists. If the surplus capacity exists in the input buffer 110, the controller increases the iteration number at operation S78. If the surplus capacity in the input buffer 110 does not exist, the controller controls the turbo decoder 120 to continue the turbo decoding on the current frame of the received signal at operation S80.

The iteration number updated in the operations S50, S70 or S78 is used as the iteration number of the turbo decoder for the next frame of the received signals.

If the condition of the channel through which the signal is transmitted is good, there will be less errors in the data. However, if the channel is not good, there will be more errors in the received signals. The more the errors exist, the greater the iteration number of the turbo-decoding should be to obtain a better error correction capacity. If there are fewer errors, good quality of error correction is obtainable with fewer iterations of turbo decoding.

According to the present invention, as described above, the iteration number of the turbo decoder 120 is preset in the memory 180 and if the error correction is sufficient by decoding the data by the number of times of the preset iteration number, the current channel is determined to be good for error correction by the preset iteration. Therefore, one less iteration for the turbo decoding is tried out for the next frame of signals. On the contrary, if the result of the error correction is not sufficient, the errors in the current channel are determined to be too severe for error correction by the preset iteration of the turbo decoder. Therefore, one more iteration for the turbo decoding is tried out for the next frame of the signals.

As shown in the operations S40 and S50, although the condition of the current channel is good, the iteration number does not decrease below the predefined minimum value. On the other hand, as shown in operations S60 and S70, although the condition of the current channel is poor, the iteration number does not increase above the predefined maximum value. Even though the error correction is incomplete to some extent, time delay and energy consumption caused by excessive iterations is prevented and an iteration number required for a normal turbo-decoding is guaranteed to be within the predefined maximum and minimum predefined limits.

If the input buffer 110 has the surplus storage capacity, the iteration number may be allowed to increase above the predefined maximum limit. In such case, the problem of time delay caused by excessive iteration will not occur. That is because, when a determination is made at operation S75 that the input buffer 110 has the surplus storage capacity, time delay of decoding operation generally does not occur while a signal received in the input buffer 110 is additionally stored, although a delay occurs by the decoding operation of the turbo decoder 120. Therefore, if the input buffer 110 has a surplus storage capacity, the iteration number may be increased at operation S78 even where the iteration number exceeds the maximum predefined limit.

If the iteration number increases above the predefined maximum limit and if the output buffer 170 does not have a surplus storage capacity, the time delay caused by excessive iteration will not be a limiting factor in the decoding. If the output buffer 170 does not have a surplus storage capacity, although a completely turbo-decoded and RS decoded signal is transmitted to the output buffer 170, a time delay will occur anyway as the completely turbo-decoded and RS decoded signal cannot be stored in the output buffer 170. Accordingly, if the output buffer 170 does not have a surplus storage capacity, the performance of an error correction can be improved by increasing the iteration number even when the iteration number exceeds the maximum value.

According to the present invention, the turbo-decoding by the optional iteration to the current channel condition is achieved adaptively by the completion of the error correction from the RS decoder. Therefore, the performance of decoding is improved. The minimal performance of the turbo decoder is secured by the predefined minimum iteration number, and an excessive time delay is prevented by the predefined maximum iteration number.

The present invention is exemplified in the above embodiment of a decoding device wherein a turbo decoder and an RS decoder are concatenated serially but the present invention may also be applied to other decoding devices having a first decoder performing iterative decoding and a second decoder which decodes the signal from the first decoder.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A decoding apparatus comprising:
   a turbo decoder which decodes an input signal in a predetermined first fashion and outputs a decoded result;
   an RS decoder which further decodes the decoded result in a predetermined second fashion, and outputs a completion signal if an error correction is completed by the RS decoder;
   a controller which controls the turbo decoder to iterate the decoding of the input signal as many times as a predetermined iteration number, to cease the decoding of the input signal if the RS decoder outputs the completion signal, and to adjust the predetermined iteration number as needed after the first iteration, wherein the controller further sets the iteration number to be greater than the predefined maximum value if a predetermined memory has storage capacity available to receive input data corresponding to the input signal to the turbo decoder, and sets the iteration number to be greater than the predefined maximum value if another predetermined memory does not have storage capacity available to store the RS-decoded signal.

2. The decoding apparatus of claim 1, wherein the controller reduces the iteration number where the completion signal occurs within a number of iterations corresponding to the iteration number.

3. The decoding apparatus of claim 2, wherein the controller sets the iteration number to a predefined minimum value if the iteration number would become smaller than the predefined minimum value as a result of the reduction.

4. The decoding apparatus of claim 1, wherein the controller increases the iteration number if the completion signal does not occur within a number of iterations corresponding to the iteration number.

5. The decoding apparatus of claim 4, wherein the controller sets the iteration number to a predefined maximum value if the iteration number would become greater than the predefined maximum value as a result of the increase.

6. The decoding apparatus of claim 4, wherein the predetermined memory comprises an input buffer, which temporarily stores input data corresponding to the input signal to the turbo decoder, and wherein the controller sets the iteration number to be greater than the predefined maximum value if the input buffer has storage capacity available to receive the input data.

7. The decoding apparatus of claim 4, wherein the another predetermined memory comprises an output buffer, which temporarily stores an output result of the RS decoder, and wherein the controller sets the iteration number to be greater than the predefined maximum value if the output buffer does not have storage capacity available to store the output result.

8. The decoding apparatus of claim 1, wherein the controller controls the turbo decoder to perform additional iterations, if the completion signal is not output within a number of iterations corresponding to the iteration number.

9. The decoding apparatus of claim 1, further comprising a memory which stores the iteration number.

10. A method of decoding comprising:
   turbo-decoding a received signal as many times as a predetermined iteration number;
   RS-decoding the turbo-decoded signal;
   determining whether error correction by the RS-decoding is completed;
   ceasing the turbo-decoding of the signal if the error correction is completed; and
   adjusting the predetermined iteration number, as needed, after the first iterations,
   wherein the increasing of the iteration number further comprises setting the iteration number to be greater than the maximum value if an input buffer for temporarily storing the received signal has storage capacity available, and wherein the increasing of the iteration number further comprises setting the iteration number to be greater than the maximum value if an output buffer for temporarily storing the RS decoded signal does not have storage capacity available.

11. The method of claim 10, wherein the adjusting comprises reducing the iteration number if the error correction is completed.

12. The method of claim 11, wherein the reducing of the iteration number comprises setting a minimum value as the iteration number if the iteration number would become smaller than the minimum value as a result of the reducing.

13. The method of claim 10, wherein the adjusting comprises increasing the iteration number if the error correction is not completed.

14. The method of claim 13, wherein the increasing of the iteration number further comprises setting a maximum value as the iteration number if the iteration number would become greater than the maximum value as a result of the increasing.

15. An apparatus for decoding input data arranged in frames, the apparatus comprising:
 a turbo decoder which iteratively decodes a current frame of the input data according to a number of iterations adjustable during operation of the apparatus and ceases the iterations in response to a completion signal; and
 an RS decoder which decodes the turbo decoded data and outputs the completion signal if error correction is completed,
 a controller which increases the number of iterations for a next frame of the input data if the completion signal is not output within the number of iterations designated for the current frame;
 an input buffer which temporarily stores the input data; and
 an output buffer which temporarily stores the RS decoded data,
 wherein the controller increases the number of iterations for the current frame to a number greater than the predetermined maximum value if the input buffer has surplus storage capacity available, and
 wherein the controller increases the number of iterations for the current frame to a number greater than the predetermined maximum value if the output buffer does not have surplus storage capacity available.

16. The apparatus of claim 15, further comprising:
 a controller which reduces the iteration number for a next frame of the input data if the completion signal is output within the number of iterations designated for the current frame.

17. The apparatus of claim 16, wherein the controller sets the number of iterations for the next frame of the input data at a minimum value if reducing the number of iterations would reduce the number of iterations for the next frame to a number less than the minimum value.

18. The apparatus of claim 17, further comprising:
 a memory which stores the minimum value and a value corresponding to the number of iterations.

19. The apparatus of claim 15, wherein the controller sets the number of iterations for the next frame of the input data at a maximum value if increasing the number of iterations would increase number of iterations for the next frame to a number greater than the maximum value.

20. The apparatus of claim 19, further comprising:
 a memory which stores the maximum value and a value corresponding to the number of iterations.

21. The apparatus of claim 15, wherein the controller controls the turbo decoder to continue iterating the current frame if the completion signal is not output within the predetermined number of iterations designated for the current frame.

* * * * *

UNITED STATES PATENT AND TRADEMARK OFFICE
CERTIFICATE OF CORRECTION

PATENT NO. : 7,222,286 B2  Page 1 of 1
APPLICATION NO. : 10/261444
DATED : May 22, 2007
INVENTOR(S) : Ki-bo Kim It is certified that error appears in the above-identified patent and that said Letters Patent is hereby corrected as shown below:

First Page, Column 2 (Abstract), Line 4, after "RS decoder" delete "RS".

Column 6, Line 63, change "iterations," to --iteration,--.

Column 7, Line 32, change "completed," to --completed;--.

Signed and Sealed this

Thirteenth Day of November, 2007

JON W. DUDAS
*Director of the United States Patent and Trademark Office*